United States Patent
Goldan et al.

(10) Patent No.: US 9,660,115 B2
(45) Date of Patent: May 23, 2017

(54) NANO-ELECTRODE MULTI-WELL HIGH-GAIN AVALANCHE RUSHING PHOTOCONDUCTOR

(71) Applicant: The Research Foundation for The State University of New York, Albany, NY (US)

(72) Inventors: Amirhossein Goldan, Middle Island, NY (US); Wei Zhao, East Setauket, NY (US); John A. Rowlands, Ontario (CA)

(73) Assignee: The Research Foundation for The State University of New York, Albany, NY (US)

( * ) Notice: Subject to any disclaimer, the term of this patent is extended or adjusted under 35 U.S.C. 154(b) by 16 days.

(21) Appl. No.: 14/888,879

(22) PCT Filed: May 29, 2014

(86) PCT No.: PCT/US2014/039992
§ 371 (c)(1),
(2) Date: Nov. 3, 2015

(87) PCT Pub. No.: WO2014/194071
PCT Pub. Date: Dec. 4, 2014

(65) Prior Publication Data
US 2016/0087113 A1    Mar. 24, 2016

Related U.S. Application Data

(60) Provisional application No. 61/828,350, filed on May 29, 2013.

(51) Int. Cl.
*H01L 31/02* (2006.01)
*H01L 27/146* (2006.01)
*G01T 1/24* (2006.01)
*H01L 31/0272* (2006.01)
*H01L 31/0376* (2006.01)
(Continued)

(52) U.S. Cl.
CPC ............ *H01L 31/0272* (2013.01); *G01T 1/24* (2013.01); *H01L 27/14676* (2013.01); *H01L 31/0376* (2013.01); *H01L 31/117* (2013.01); *H01L 31/18* (2013.01)

(58) Field of Classification Search
CPC . G01T 1/24; H01L 27/14676; H01L 31/0272; H01L 31/0376; H01L 31/117; H01L 31/18
See application file for complete search history.

(56) References Cited

U.S. PATENT DOCUMENTS

| | | | |
|---|---|---|---|
| 5,892,222 | A | 4/1999 | Elabd |
| 2001/0025935 | A1 | 10/2001 | Ogawa |

(Continued)

OTHER PUBLICATIONS

PCT/ISA/237 Written Opinion issued on PCT/US2014/039992 pp. 4.

(Continued)

*Primary Examiner* — Mark R Gaworecki
(74) *Attorney, Agent, or Firm* — The Farrell Law Firm, P.C.; John F. Gallagher, III

(57) ABSTRACT

Provided is a detector that includes a scintillator, a common electrode, a pixel electrode, and a plurality of insulating layers, with a plurality of nano-pillars formed in the plurality of insulating layers, a nano-scale well structure between adjacent nano-pillars, with a-Se separating the adjacent nano-pillars, and a method for operation thereof.

20 Claims, 6 Drawing Sheets

(51) Int. Cl.
  *H01L 31/117* (2006.01)
  *H01L 31/18* (2006.01)

(56) References Cited

U.S. PATENT DOCUMENTS

| | | |
|---|---|---|
| 2008/0245968 A1 | 10/2008 | Tredwell et al. |
| 2011/0163306 A1 | 7/2011 | Furui et al. |
| 2012/0038013 A1 | 2/2012 | Karim et al. |
| 2012/0266658 A1 | 10/2012 | Akiyama et al. |

OTHER PUBLICATIONS

PCT/ISA/210 Search Report issued on PCT/US2014/039992 pp. 2.

Spanoudaki, Virginia Ch. et al., Photo-Detectors for Time of Flight Positron Emission Tomography (ToF-PET), Sensors 2010, 10, pp. 10484-10505.

Goldan, A. H. et al., Unipolar time-differential pulse response with a solid-state Charpak photoconductor, Applied Physics Letters 101, 213503 (2012) Copyright 2012 American Institute of Physics, pp. 6.

Rubel, O. et al., Lucky-drift model for avalanche multiplication in amorphous semiconductors, Phys. Stat. Sol. (c) 1, No. 5, 1186-1193 (2004) Copyright 2004 Wiley-VCH Verlag GmbH & Co. KGaA Weinheim, pp. 8.

Wronski, M. M. et al., A solid-state amorphous selenium avalanche technology for low photon flux imaging applications, Med. Phys. 37 (9), Sep. 2010 Copyright 2010 Am. Assoc. Phys. Med., pp. 4.

Tanioka, Kenkichi, The ultra sensitive TV pickup tube from conception to recent development, J Mater Sci: Mater Electron (2007), pp. 5.

Goldan, A. H. et al., Unipolar time-differential charge sensing in non-dispersive amorphous solids, Journal of Applied Physics 113, 224502 (2013) Copyright 2013 AIP Publishing LLC, pp. 17.

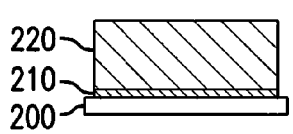
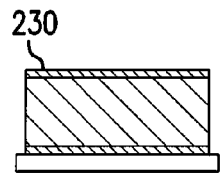
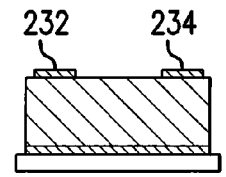
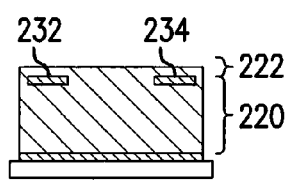
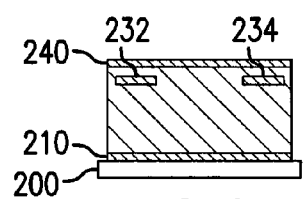
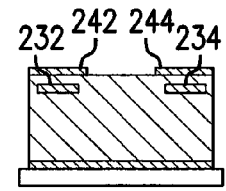
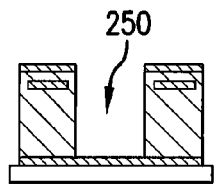
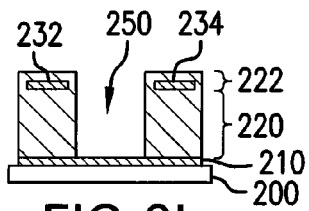
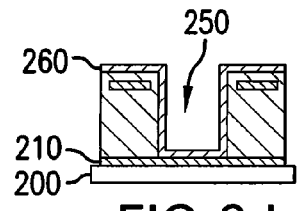
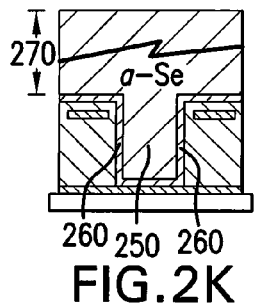
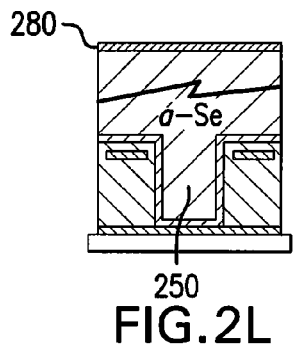
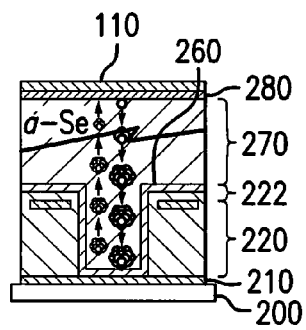

NANO-ELECTRODE MULTI-WELL HIGH-GAIN AVALANCHE RUSHING PHOTOCONDUCTOR

PRIORITY

This application claims priority to U.S. Provisional Patent Application No. 61/828,350 filed with the U.S. Patent and Trademark Office on May 29, 2013, the content of which is incorporated herein by reference.

BACKGROUND OF THE INVENTION

1. Field of the Invention

The present invention relates generally to solid-state imaging detectors of ionizing radiation and, in particular, to amorphous selenium radiation detectors having an ultra-fast photo response and ultra-high time resolution.

2. Description of the Related Art

Amorphous selenium (a-Se) was previously developed for photocopying machines. A-Se has been commercially revived as a direct x-ray photoconductor for Flat-Panel Detectors (FPDs) due to high x-ray sensitivity and uniform evaporation over a large area as a thick film. However, current direct conversion FPDs are limited by, inter alia, degradation of low-dose imaging performance due to electronic noise, because energy required to generate an electron-hole pair in a-Se is 50 eV at 10 V/micron. Although other photoconductive materials with higher conversion have been investigated, the other photoconductive materials suffer from charge trapping and manufacturing issues. Improved conversion of a-Se is possible by increasing the electric field above 30 V/micron, i.e., 30,000 V on a 1,000 micron layer. However, such electric field increase is extremely challenging for reliable detector construction and operation, and is virtually impractical.

High resistivity amorphous solids used as photoconductors, especially amorphous selenium, are of interest because the high resistivity amorphous solids are readily produced over a large area at substantially lower cost than grown crystalline solids.

However, amorphous solids, i.e., non-crystalline solids with disorder, have been ruled out as viable radiation imaging detectors in a photon-counting mode because of low temporal resolution due to low carrier mobilities and transit-time limited pulse response, and low conversion gain of high energy radiation to electric charge. Avalanche multiplication in selenium can be used to increase the electric charge gain. However, significant obstacles prevent practical implementation of a direct conversion a-Se layer with separate absorption and avalanche regions.

A-Se has approximately 90% detection efficiency in blue wavelength, making A-Se ideal for coupling to Time of Flight (TOF) specific scintillators for high-energy radiation detection. A drawback of a-Se is poor time-resolution and low mobility due to shallow traps, problems that conventional devices have not circumvented for TOF detectors.

Direct conversion x-ray Flat-Panel Imagers (FPIs) provide high resolution and high detection efficiency, and detectors based on active matrix Thin Film Transistor (TFT) array readout of amorphous selenium photoconductor have been commercialized for general radiographic as well as mammographic clinical applications. However, conventional systems have only shown continuous and stable avalanche multiplication in a-Se, a feature that enabled development of an optical camera one hundred times more sensitive than a state of the art Charge Coupled Device (CCD) camera. See, M. M. Wronski, et al., Med. Phys. 37, 4982 (2010); and K. Tanioka, J. Mater. Sci., Mater. Electron. 18, pp. 321-325 (2007).

Positron Emission Tomography (PET) is a nuclear medical imaging modality that produces three dimensional (3D) images to see functional processes in human body. PET is commonly used in clinical oncology for detecting cancer, and for clinical diagnosis of heart problems and brain disorders. After positron-emitting radionuclides are introduced into the body, the radionuclides decay with each annihilation emitting two photons in diametrically opposing directions. TOF PET systems detect these photons, use TOF information to determine if two registered photons are in time coincidence, in which case the registered photons belong to a same positron annihilation event, and use the arrival time difference to localize each annihilation event. Without TOF localization data, computationally expensive iterative reconstruction algorithms are used to estimate 3D distribution of events that provide the best match with the measured projection data. Localization accuracy $\Delta x$ of a TOF PET is determined by time-resolution $\Delta t$ of the radiation detector, according to $\Delta x = c\Delta t/2$, where c is the speed of light.

An ultimate TOF detector, i.e., a TOF detector having a $\Delta t$ less than 10 picosecond (ps), has not been realized. Existing commercial systems utilize PhotoMultiplier Tubes (PMTs) based on a plano-concave photocathode, which only achieve a $\Delta t$ of approximately 500 ps. Silicon PhotoMultipliers (SiPMs), which are based on Geiger mode operating avalanche photodiodes, have achieved a better $\Delta t$, i.e., SiPM $\Delta t \sim 100$ ps. However, conventional systems suffer from high cost of PMTs and other components, complicated plano-concave photocathode arrangements, poor photon detection efficiency, optical crosstalk, small area, and poor uniformity.

SUMMARY OF THE INVENTION

Accordingly, aspects of the present invention address the above problems and disadvantages, and provide the advantages described herein. An aspect of the present invention provides a TOF detector that uses a-Se as the photoconductive material to provide a radiation detector and method for operation of same that overcomes disadvantages of conventional detectors. Another aspect of the present invention provides a Nano-Electrode multi-Well High-gain Avalanche Rushing Photoconductor (NEW-HARP).

An aspect of the present invention provides a detector that includes a scintillator, a common electrode, a pixel electrode, and a plurality of insulating layers, with a plurality of nano-pillars formed in the plurality of insulating layers, a nano-scale well structure between adjacent nano-pillars, with a-Se separating the adjacent nano-pillars, and a method for operation thereof.

Another aspect of the present invention provides a detection method that includes detecting movement of holes in a detection region of a detector that includes a scintillator, a common electrode, a pixel electrode, a plurality of insulating layers and a substrate, with the plurality of nano-pillars being formed in the plurality of insulating layers, with a nanoscale well structure between adjacent nano-pillars, amorphous selenium (a-Se) separating the adjacent nano-pillars, and the a-Se filling the nanoscale well structure, to provide an avalanche transport region separating the nano-pillars and the common electrode.

A further aspect of the present invention provides a method for manufacture of a detector that includes a common electrode, a pixel electrode, and a plurality of insulating layers, by forming a plurality of nano-pillars in the plurality of insulating layers, with a nanoscale well structure between adjacent nano-pillars, and injecting amorphous selenium (a-Se) between the adjacent nano-pillars.

BRIEF DESCRIPTION OF THE DRAWINGS

The above and other aspects, features and advantages of certain embodiments of the present invention will be more apparent from the following detailed description taken in conjunction with the accompanying drawings, in which:

FIGS. 2(a)-2(m) illustrate fabrication of the photodetector, according to an aspect of the present invention;

DETAILED DESCRIPTION OF EMBODIMENTS OF THE INVENTION

The following detailed description of certain embodiments of the present invention will be made with reference to the accompanying drawings. In describing the invention, explanation about related functions or constructions known in the art are omitted for the sake of clearness in understanding the concept of the invention, to avoid obscuring the invention with unnecessary detail.

Provided is a nano-pattern multi-well selenium detector that combines avalanche multiplication and Unipolar Time-Differential (UTD) charge sensing benefits in one device, and method for manufacture of and detection utilizing the nano-pattern multi-well selenium detector. The nano-pattern multi-well selenium detector, i.e., photodetector, combines avalanche multiplication and UTD charge sensing benefits in a single device fabricated by preparing a nano-pattern substrate, growing a structure on the substrate, and evaporating a-Se over the structure to form a photoconductive avalanche layer, thereby providing a detector structure as a nano-electrode multi-well high-gain avalanche rushing photodetector that provides picosecond time resolution. The photodetector structure includes high granularity micro-pattern multi-wells to provide an improved fabricated UTD solid-state detector. As described herein, time-of-light test results show, based on UTD charge sensing, substantially improved detector time resolution and achievement a Δt of less than 10 ps physical limit in signal rise time, which is set by spreading of the photo-induced carrier packet.

Aspects of the present invention provide avalanche multiplication gain in amorphous semiconductors, due to impact ionization in the presence of a strong electric field, i.e., exceeding 80 V/μm, with the transport mechanism shifted from localized states into extended states.

Figure 1:
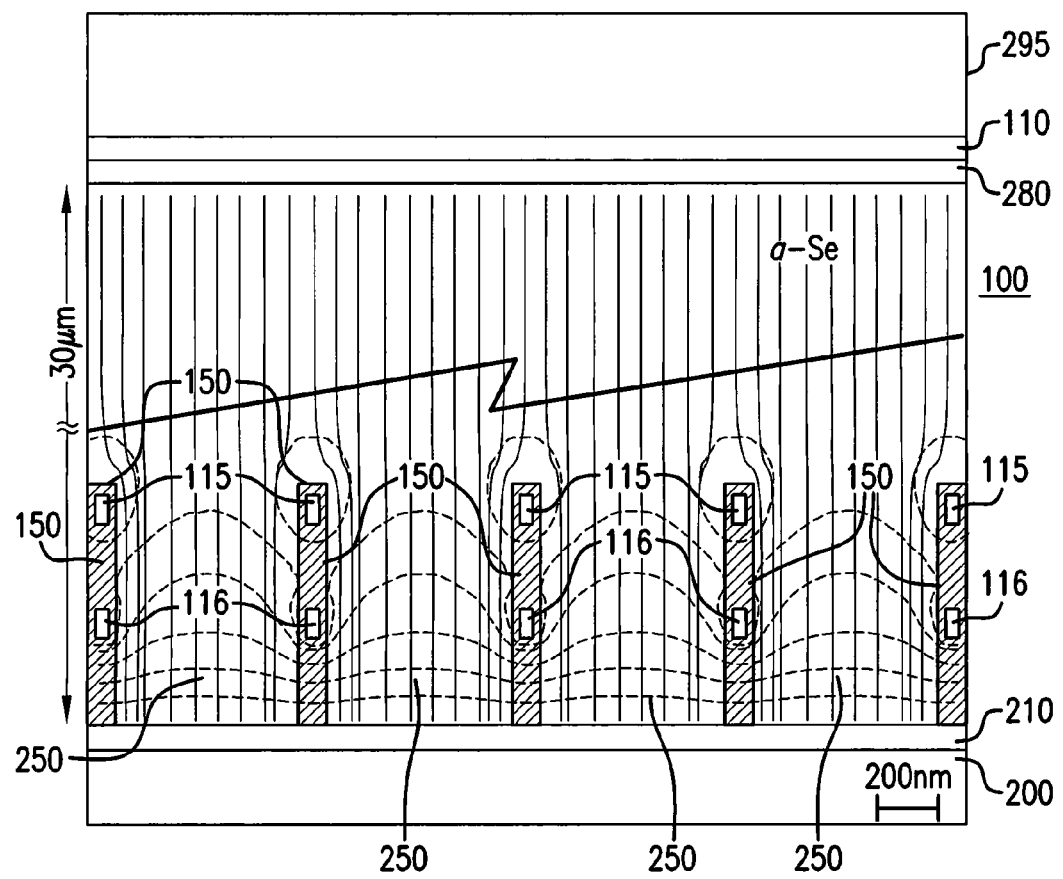
FIG. 1 is a schematic side view of a picosecond detector structure, according to an aspect of the present invention.

FIG. 1 provides a schematic side view of a picosecond detector structure 100, according to an aspect of the present invention. In FIG. 1, avalanche a-Se forms a photoconductive film that fills nano-pattern multi-wells 150 for UTD charge sensing.

As shown in FIG. 1, a plurality of insulating nano-pillars 150 are preferably evenly spaced over pixel electrode 210, i.e., collector, showing an embodiment having first and second nano-electrode Frisch grids 115, 116 embedded within respective nano-pillars 150, formed by nano-patterning using electron beam lithography, as described in regards to FIGS. 2(a)-2(m). Once the nano-pattern substrate is prepared, a-Se is evaporated over the substrate to provide photoconductive avalanche layer, forming a nano-electrode multi-well high-gain avalanche rushing photodetector structure. Also shown in FIG. 1 is an ultra-fast scintillator 295, preferably formed of one of sodium iodide activated with thallium, NaI(Tl), Bismuth Germanium Oxide (BGO), Gadolinium Silicate (GSO), Lutetium Oxyorthosilicate (LSO), Lanthanum(III) bromide (LaBr3), and Cerium-doped lanthanum chloride (LaCl3:Ce). The ultra-fast scintillator 295 converts x-rays and gamma ray photons to optical photons, which impinge on common electrode 110, which is discussed below in regards to FIG. 2(m).

FIGS. 2(a)-2(m) are side profile views illustrating steps for photodetector sensor structure fabrication. FIG. 2(a) shows a pixel electrode 210 deposited via, e.g., Physical Vapor Deposition (PVD), on substrate 200, which is preferably formed of glass or silicon, patterned using optical lithography, to form a patterned grid electrode. FIG. 2(b) shows a first insulator layer 220 deposited over pixel electrode 210 by, e.g., thermal growth, via plasma-enhanced chemical vapor deposition, PVD, or spin casting.

FIG. 2(c) shows deposition via, e.g., PVD, of first electrode 230 over first insulator layer 220. FIG. 2(d) shows removal, via nano-patterning and nano-lithography, e.g., Electron Beam Lithography (EBL), of a center position of first electrode 230 to create first grid patterned electrodes 232, 234. FIG. 2(e) shows deposition of a second insulator layer 222 over first patterned grid electrodes 232, 234, with first insulator layer 220 and second insulator layer 222 forming a plurality of stacked insulating layers.

FIG. 2(f) shows deposition of a second electrode 240 over the second insulator layer 222, and FIG. 2(g) shows well-mask electrode 242, 244 created by nano-patterning of second electrode 240. FIG. 2(h) shows first insulator 220 etched via, e.g., Reactive Ion Etching (RIE), to create a nanoscale well structure 250.

Figure 6:
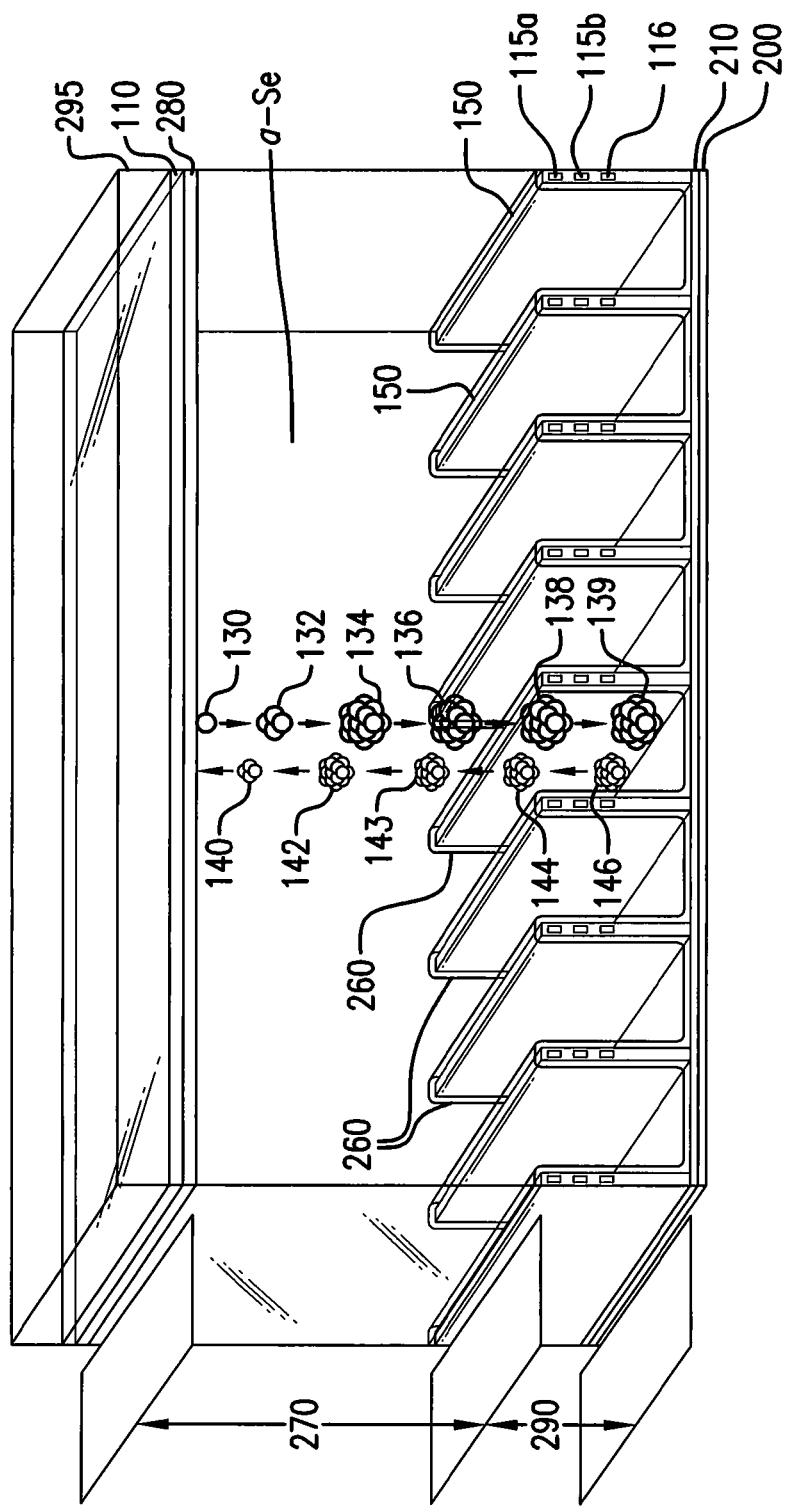
FIG. 6 is a schematic view of the photodetector of the present invention.

As shown in FIG. 2(i), well-mask electrode 242, 244 is also removed by etching, e.g., by RIE or chemical etching, and as shown in FIG. 2(j), an electron blocking layer 260 is created over, and conforms to inner contour of, each nanoscale well structure 250, as shown in FIG. 6.

FIG. 2(k) and FIG. 6 illustrate a-Se evaporated over each of the plurality of nano-scale well structures 250. FIG. 2(l) shows a hole blocking layer 280 created over the a-Se avalanche photoconductive layer 270, and FIG. 2(m) shows common electrode 110 that is created over hole blocking layer 280, which keeps holes from entering into an avalanche transport region from the common electrode 110, and is preferably formed of one of Bathocuproine (BCP), Zinc Oxide (ZnO), Magnesium Oxide (MgO), and Cerium Oxide (CeO). The electron blocking layer 260 is preferably formed of one of Arsenic Triselenide ($As_2Se_3$) and Poly N-vinyl-carbazole (PVK).

Common electrode 110 is transparent to electromagnetic radiation, e.g., optical photons, x-rays, and gamma rays. FIGS. 2(a)-2(m) show a single first patterned grid electrode 232, 234, but more than one grid electrodes can be provided with additional electrodes, as shown in FIGS. 1 and 6. Patterned grid electrodes 232, 234 form a nano-electrode grid that erases, i.e. masks, electron detection within a detection region 290, which is described below, thereby allowing for improved detection outside of the avalanche transport region, which is a region of electron and hole growth.

Figure 3:
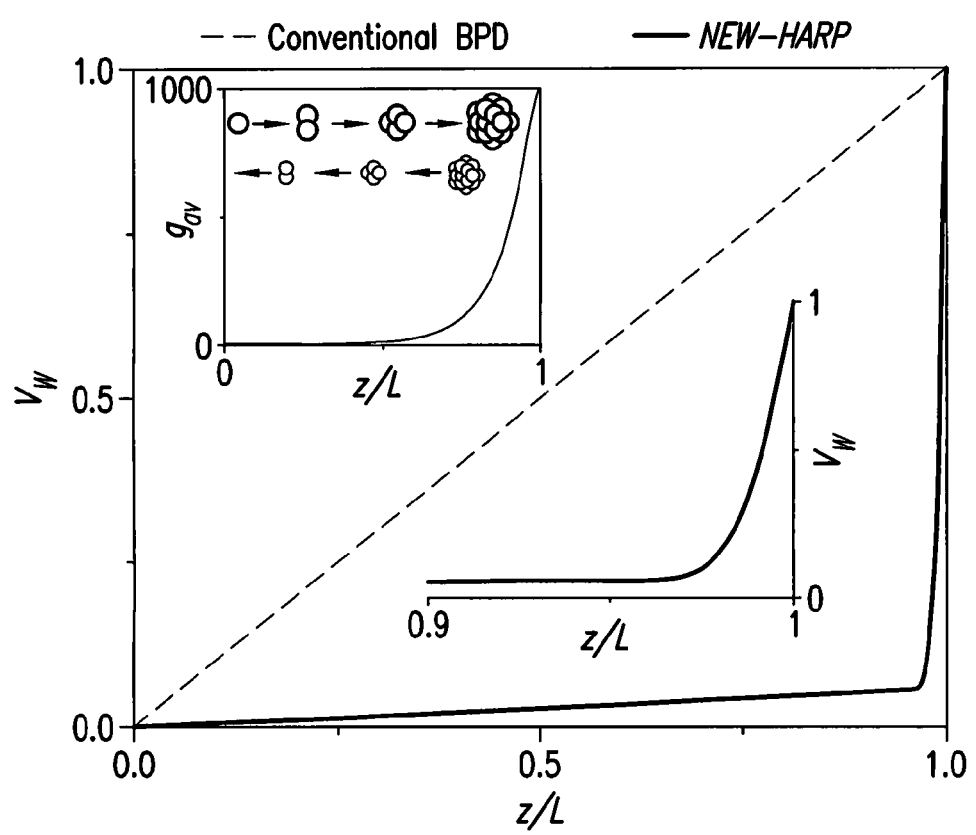
FIG. 3 is a chart showing weighting potential distribution of the photodetector of the present invention and a conventional Bipolar Planar Detector (BPD)

FIG. 3 is a chart of weighting potential distribution comparing the detector of the present invention with a conventional BPD. As shown in FIG. 3, weighting potential distribution shows nearly ideal UTD charge sensing for the detector of the present invention, with the conventional BPD shown for comparison. For non-avalanche a-Se detectors with shallow-trap-limited drift mobility, a charge broadening exists due to diffusion, mutual Coulombic repulsion, and most importantly, fluctuations of shallow-trap release time. See, A. H. Goldan, et al., Appl. Phys. Lett. 101, p. 213503 (2012). However, for avalanche a-Se with associated exponential impact ionization gain, as shown in the top inset of FIG. 3, holes experience band transport in extended states with non-activated microscopic mobility of 1 cm$^2$Vs. Given that bulk thickness (L) is very thin and operating field (F) is very high for avalanche detectors, i.e., L=30 nm and F=100 V/fim, holes experience negligible interruption by capture and thermal-release events due to shallow traps. Furthermore, in the small-signal case, spreading due to mutual Coulomb repulsion of the free charge density can be neglected. The bottom inset of FIG. 3 shows finite width of the $V_W$ distribution, close to pixel electrode 210 for the nanopattern multi-well substrate 100, with impulse response considering the limitations of charge spreading due to drift diffusion and finite width of $V_W$ distribution.

Figure 4:
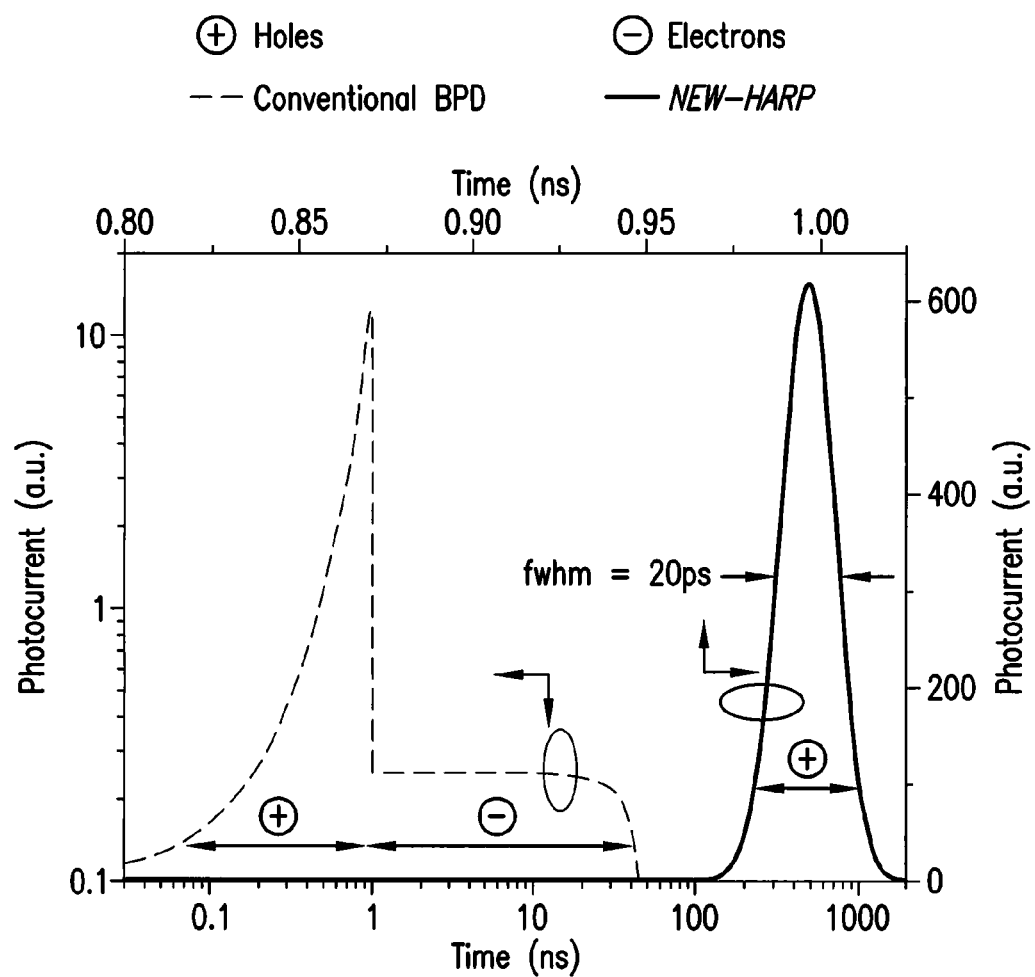
FIG. 4 is a chart showing induced photocurrent due to impulse excitation of the photodetector of the present invention and a conventional BPD.

FIG. 4 is a chart of induced photocurrent due to impulse excitation comparing the detector of the present invention with a conventional BPD, showing induced photocurrent due to impulse excitation. The impulse response photocurrent of the conventional BPD has a fast exponential component due to the drift of high-mobility avalanched holes (130-136, FIG. 6) and a slow rectangular component due to the drift of slow electrons. A majority of avalanche gain occurs near the collector, where holes are almost instantly neutralized, and a detected integrated charge signal is obtained mainly from electron motion.

Figure 5:
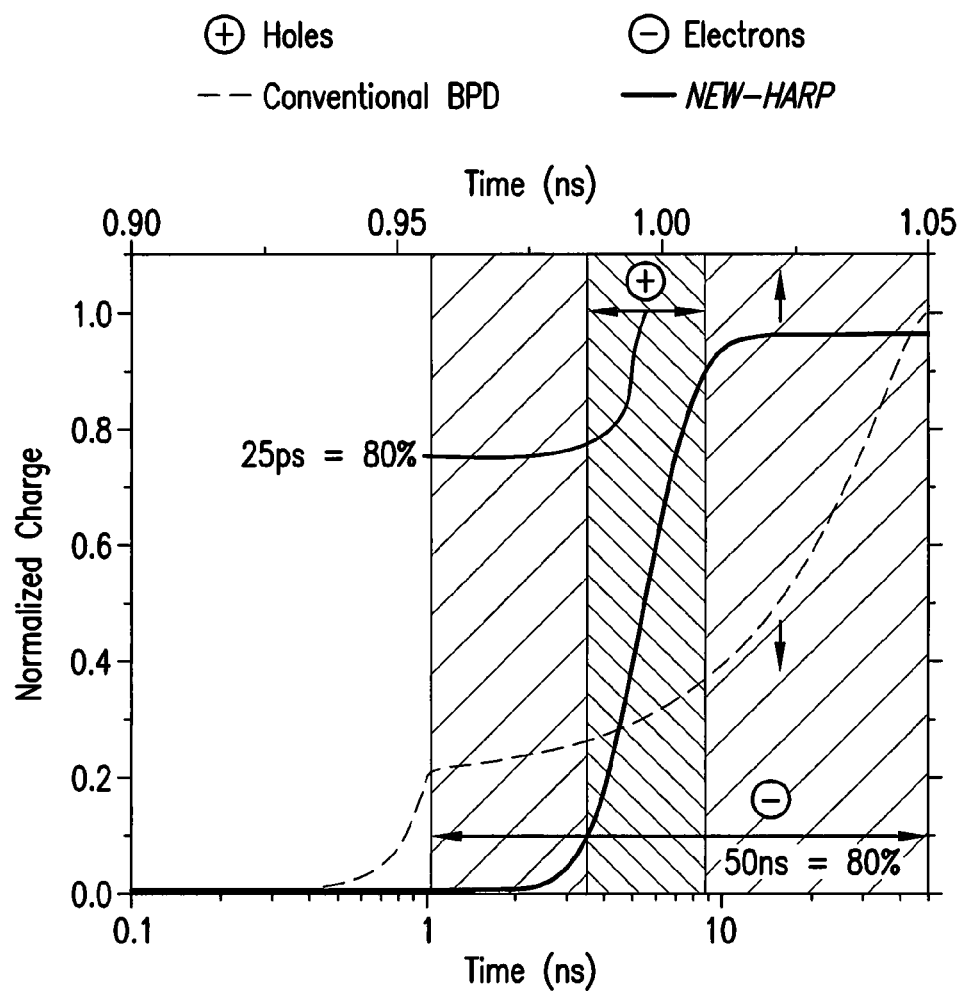
FIG. 5 is a chart showing normalized integrated charge over time of the photodetector of the present invention and a conventional BPD.

FIG. 5 is a chart of normalized integrated charge over time comparing the detector of the present invention with a conventional BPD. As illustrated in FIG. 5, the integrated current waveform, i.e., collected charge, in BPD is temporally limited by electron motion and signal rise time of approximately 50 ns. However, in the photodetector of the present invention, which is labelled NEW-HARP in FIGS. 3-5, the electrostatically shielding nano-pillars enable UTD charge sensing. The photodetector yields impulse response time of 20 ps at Full Width at Half Maximum (FWHM), as shown in FIG. 4, and signal rise time of 25 ps, i.e., the time required for the collected charge to rise from 10% to 90% of final value, as shown in FIG. 5. Advanced nano-lithography allows for diffusion-limited response with greater than three orders-of-magnitude improvement in time resolution.

For a-Se operating in the avalanche mode at high electric fields, charge drift occurs via band transport in the extended states with non-activated microscopic mobility, and thus, photocarriers experience negligible interruption by capture and thermal-release events due to shallow traps. The implication of (1) non-activated microscopic band-mobility, (2) avalanche gain, and (3) UTD charge sensing show photodetector achievement of 10 ps time-resolution utilizing low-cost material that is uniformly scalable to a large area.

FIG. 6 is a schematic view of the photodetector of the present invention, also illustrating electron movement therein. FIG. 6 shows a plurality of nanoscale well structures 250 and provides an exploded view of multiplication gain in the avalanche transport region formed by avalanche photoconductive layer 270 on an side of a detection region 290 opposite substrate 200. As shown in FIG. 6, the avalanche photoconductive layer 270 is formed between detection region 290 and hole blocking layer 280, which blocks injection of holes from common electrode 110 into the photoconductive layer, e.g., a-Se, thereby reducing leakage current.

Detection region 290 is provided within respective nanoscale well structures 250 and, as shown in FIG. 6, as holes 130, 132, 134, 136 drift through the a-Se avalanche photoconductive layer 270, which forms an avalanche transport region, i.e., an avalanche gain region in which the number of holes grow due to impact ionization. Once in detection region 290, holes 138, 139 do not substantially grow in size. Also shown in FIG. 6 is a decreasing number of electrons 140, 142, 143 with increasing distance from the detection region 290, with electron 143 being of maximum size closest to detection region 290 and electron 140 being smallest in size furthest from detection region 290.

Accordingly, a detector is provided that includes scintillator 295, common electrode 110, pixel electrode 210, a plurality of insulating layers, 220, 222, an electron blocking layer 260 separating a plurality of nano-pillars 150 and the nanoscale well structure 250 from the a-Se, with the electron blocking layer defining detection region 290. The plurality of nano-pillars 150 are formed in the plurality of insulating layers 220, 222, with nanoscale well structure 250 being formed between adjacent nano-pillars and a-Se separating the adjacent nano-pillars and filling the nanoscale well structure. Avalanche gain occurs above the electron blocking layer, outside of the detection region, with nano-electric Frisch grid 115, 116 embedded within each nano-pillar, with the nano-electric grid masking detection of electrons within the detection region.

Also, hole blocking layer 280 is provided between common electrode 110 and the a-Se, with hole blocking layer 280 being transparent to a wavelength of incoming photons, and possessing virtually no hole transport to trap holes that are injected while allowing electrons to exit a-Se to reach common electrode 110. Hole blocking layer 280 can be provided via a plurality of layers combining separate functions or by a single layer n-type polymeric material having a wide gap. Geometry of the nano-grid and pillars determine the electric field in the avalanche transport, i.e., gain, region 270 and in detection region 290, with field strength and gain being variable by design geometry, a-Se thickness, common electrode bias voltage, and nano-grid bias voltage, thereby providing flexibility for broad application of the detector.

Accordingly, the present invention provides advantages of avalanche mode a-Se having photo-conductive gain and band transport in the extended states with the highest possible mobility and negligible trapping. Importantly, UTD charge sensing enables operating the detector at its theoretical limit of charge diffusion, and provides UTD charge sensing with avalanche mode a-Se improving Δt by more than three orders of magnitude for achievement of 10 ps time-resolution with a material that is low-cost and uniformly scalable to large-area.

An aspect of the present invention provides advantages over conventional direct conversion FPIs that include providing additional gain through impact avalanche, thus allowing the detection of a single x-ray photon, and providing improved temporal performance through unipolar sensing, thereby allowing quantum noise limited performance for conventional x-ray integration detection to be performed at a single x-ray photon level, and also enables photon counting with excellent energy resolution and high count rate, thereby allowing spectral imaging detectors made at reduced cost compared to single crystal Cadmium telluride (CdTe) detectors. Aspects of the present invention provide advantages over conventional detectors provide applications in medical imaging, e.g., TOF PET and particle physics, e.g., Cherenkov imaging defectors and trackers, as well as optical communication and time-domain spectroscopy.

While the invention has been shown and described with reference to certain aspects thereof, it will be understood by those skilled in the art that various changes in form and details may be made therein without departing from the spirit and scope of the present invention as defined by the appended claims and equivalents thereof.

What is claimed is:

1. A detector comprising:
   a common electrode;
   a pixel electrode; and
   a plurality of insulating layers,
   wherein a plurality of nano-pillars are formed in the plurality of insulating layers, with a nanoscale well structure between adjacent nano-pillars, and
   wherein amorphous selenium (a-Se) separates the adjacent nano-pillars.

2. The detector of claim 1, wherein the a-Se fills the nanoscale well structure.

3. The detector of claim 1, wherein an avalanche transport region separates the nano-pillars and the common electrode.

4. The detector of claim 1, further comprising an electron blocking layer separating the nano-pillars and the nanoscale well structure from the a-Se.

5. The detector of claim 4, wherein the electron blocking layer defines a detection region.

6. The detector of claim 1, further comprising a scintillator adjacent to the common electrode, on a side of the common electrode opposite the plurality of insulating layers.

7. The detector of claim 6, wherein avalanche gain occurs above the electron blocking layer, outside of the detection region.

8. The detector of claim 1, further comprising a nano-electric Frisch grid embedded within each nano-pillar.

9. The detector of claim 1, further comprising a hole blocking layer between the common electrode and the a-Se.

10. A detection method comprising:
    detecting movement of holes in a detection region of a detector that includes a scintillator, a common electrode, a pixel electrode, a plurality of insulating layers and a substrate,
    wherein the plurality of nano-pillars are formed in the plurality of insulating layers, with a nanoscale well structure between adjacent nano-pillars, and amorphous selenium (a-Se) separates the adjacent nano-pillars.

11. The method of claim 10, wherein the a-Se fills the nanoscale well structure.

12. The method of claim 10, wherein an avalanche transport region separates the nano-pillars and the common electrode.

13. The method of claim 10, wherein an electron blocking layer separates the nano-pillars and the nanoscale well structure from the a-Se.

14. The method of claim 13, wherein the electron blocking layer defines the detection region.

15. The method of claim 14, wherein avalanche gain occurs above the electron blocking layer, outside of the detection region.

16. The method of claim 10, wherein a nano-electric grid is embedded within each nano-pillar.

17. The method of claim 16, wherein the nano-electric grid is a Frisch grid.

18. The method of claim 16, wherein the nano-electric grid masks detection of electrons within the detection region.

19. The method of claim 10, wherein a hole blocking layer is provided between the common electrode and the a-Se.

20. A method of manufacture of a detector that comprises a common electrode, a pixel electrode, and a plurality of insulating layers, the method comprising:
    forming a plurality of nano-pillars in the plurality of insulating layers, with a nanoscale well structure between adjacent nano-pillars, and
    injecting amorphous selenium (a-Se) between the adjacent nano-pillars.

* * * * *